(12) United States Patent
Zheng et al.

(10) Patent No.: US 11,984,084 B2
(45) Date of Patent: May 14, 2024

(54) SHIFT REGISTER, DRIVING METHOD THEREOF, GATE DRIVE CIRCUIT, AND DISPLAY DEVICE

(71) Applicant: BOE Technology Group Co., Ltd., Beijing (CN)

(72) Inventors: Can Zheng, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 393 days.

(21) Appl. No.: 17/414,600

(22) PCT Filed: Dec. 29, 2020

(86) PCT No.: PCT/CN2020/141034
§ 371 (c)(1),
(2) Date: Jun. 16, 2021

(87) PCT Pub. No.: WO2021/143522
PCT Pub. Date: Jul. 22, 2021

(65) Prior Publication Data
US 2023/0360607 A1 Nov. 9, 2023

(30) Foreign Application Priority Data
Jan. 17, 2020 (CN) .......................... 202010052904.4

(51) Int. Cl.
*G09G 3/3266* (2016.01)
*G09G 3/36* (2006.01)
*G11C 19/28* (2006.01)

(52) U.S. Cl.
CPC ......... *G09G 3/3266* (2013.01); *G09G 3/3677* (2013.01); *G11C 19/28* (2013.01);
(Continued)

(58) Field of Classification Search
CPC ......... G09G 2310/0286; G09G 3/3677; G09G 3/20; G09G 2310/08; G09G 2310/0267;
(Continued)

(56) References Cited

U.S. PATENT DOCUMENTS 10,902,932 B2 * 1/2021 Feng .................... H01L 27/1262
11,100,841 B2 * 8/2021 Wang .................... G09G 3/2092
(Continued)

FOREIGN PATENT DOCUMENTS

CN 104809978 A 7/2015
CN 105206246 A 12/2015
(Continued)

OTHER PUBLICATIONS

CN202010052904.4 First Office Action.

*Primary Examiner* — Dismery Mercedes
(74) *Attorney, Agent, or Firm* — IPro, PLLC

(57) ABSTRACT

The disclosure relates to a shift register, a driving method thereof, a gate drive circuit, and a display device. An output pulse width can be reduced by 1/(n+1) to (n−1)/(n+1) clock cycle by setting a pulse width modulation module (104), where n is the number of clock signal terminals in one-to-one correspondence with the enable signal terminals, and the pulse width reduced by 1/(n+1) to (n−1)/(n+1) clock cycle needs to be output several times under the condition that the light emitting duration of pixels is unchanged. In this way, the refresh rate is increased, and thus the flicker phenomenon in the process of low gray-scale brightness adjustment is less detectable to the human eyes.

17 Claims, 8 Drawing Sheets

(52) U.S. Cl.
CPC ............... *G09G 2300/0408* (2013.01); *G09G 2310/0286* (2013.01); *G09G 2320/0247* (2013.01); *G09G 2320/064* (2013.01)

(58) Field of Classification Search
CPC ............... G09G 3/2092; G09G 3/3266; G09G 2310/0289; G09G 2320/0233; G09G 2310/06; G09G 2320/0247; G09G 2320/0257; G09G 2320/0271; G09G 2320/02; G09G 3/3648; G09G 3/3688; G09G 2300/0408; G09G 2320/0242; G09G 2320/04; G11C 19/28; G11C 27/04
See application file for complete search history.

(56) References Cited

U.S. PATENT DOCUMENTS

| | | | |
|---|---|---|---|
| 2010/0156474 A1* | 6/2010 | Park | H03K 19/00361 327/108 |
| 2015/0302936 A1* | 10/2015 | Ma | G11C 19/28 377/64 |
| 2016/0133184 A1* | 5/2016 | Gupta | G09G 3/3225 345/82 |
| 2016/0307641 A1* | 10/2016 | Zheng | G09G 3/3648 |
| 2017/0039950 A1* | 2/2017 | Li | G11C 19/28 |
| 2017/0124969 A1 | 5/2017 | Dai | |
| 2017/0330633 A1 | 11/2017 | Sun et al. | |
| 2018/0174521 A1 | 6/2018 | Zheng et al. | |
| 2018/0350315 A1* | 12/2018 | Zhang | G09G 3/3677 |
| 2019/0066604 A1* | 2/2019 | Kong | G09G 3/3291 |
| 2019/0295489 A1 | 9/2019 | Wang et al. | |
| 2019/0325834 A1* | 10/2019 | Feng | G09G 3/3648 |
| 2020/0357342 A1 | 11/2020 | Feng et al. | |

FOREIGN PATENT DOCUMENTS

| | | |
|---|---|---|
| CN | 105304057 A | 2/2016 |
| CN | 108172170 A | 6/2018 |
| CN | 108172192 A | 6/2018 |
| CN | 109427285 A | 3/2019 |
| CN | 109599144 A | 4/2019 |
| CN | 111179806 A | 5/2020 |
| KR | 20180058279 A | 6/2018 |
| WO | 2016073078 A1 | 5/2016 |

* cited by examiner

SHIFT REGISTER, DRIVING METHOD THEREOF, GATE DRIVE CIRCUIT, AND DISPLAY DEVICE

CROSS REFERENCE TO RELATED APPLICATIONS

The present application is a national phase entry under 35 U.S.C. § 371 of International Application No. PCT/CN2020/141034, filed on Dec. 29, 2020, which claims priority to Chinese Patent Application No. 202010052904.4, filed to the China Patent Office on Jan. 17, 2020, the entire contents of which are incorporated herein by reference.

FIELD

The disclosure relates to the field of display technology, and in particular, to a shift register, a driving method thereof, a gate driving circuit, and a display device.

BACKGROUND

Among gate driver on array (GOA) circuits, there is a kind of GOA circuit used to control light emitting time of pixels. This type of GOA circuit is called an EMGOA circuit, and is usually implemented by a cascaded plurality of shift registers. An output pulse width of a shift register determines the light emitting time of pixels. However, the output pulse width of the shift register in the related technology is relatively large, resulting in a flicker phenomenon in the process of low gray-scale brightness adjustment, which affects the display quality.

SUMMARY

In view of this, embodiments of the disclosure provide a shift register, a driving method thereof, a gate drive circuit, and a display device, to solve the flicker problem in the process of low gray-level brightness adjustment in the prior art.

The shift register provided in an embodiment of the disclosure includes an input module, an output module, a potential maintenance module and a pulse width modulation module, wherein
  the input module is coupled to a trigger signal terminal, and the input module is configured to write a second level of the trigger signal terminal to a first control terminal of the output module under the control of a first level of a first clock signal terminal, and write the first level of a second clock signal terminal to a second control terminal of the output module under the control of the first level of the second clock signal terminal;
  the pulse width modulation module includes a plurality of pulse width modulation submodules, the pulse width modulation submodules being coupled to the trigger signal terminal, and each of the pulse width modulation submodules being configured to write the first level of the trigger signal terminal to a second control terminal of the output module and to a control terminal of the potential maintenance module under the control of the first level of a clock signal terminal and the first level of an enable signal terminal,
  wherein one of a plurality of clock signal terminals coupled to the pulse width modulation submodules is the second clock signal terminal, and the rest are other clock signal terminals than the first clock signal terminal and the second clock signal terminal; the first clock signal terminal, the second clock signal terminal, and the other clock signal terminals jump successively to the first level;
  the output module is coupled to a signal output terminal, and the output module is configured to write the second level of a second level signal terminal to the signal output terminal when the trigger signal terminal outputs the second level and the second clock signal terminal outputs a first level, and write the first level of a first level signal terminal to the signal output terminal when the trigger signal terminal and the clock signal terminal simultaneously output the first level; and
  the potential maintenance module is configured to maintain potentials of the first control terminal and the second control terminal of the output module under the control of the first level of the trigger signal terminal.

In some embodiments, in the above-mentioned shift register provided in the embodiment of the disclosure, the input module includes a first transistor, a second transistor, a third transistor, a fourth transistor, a fifth transistor, and a first capacitor,
  the first transistor having a gate coupled to the first clock signal terminal, and a first electrode coupled to the trigger signal terminal;
  the second transistor having a gate coupled to a second electrode of the first transistor, and a first electrode coupled to the first clock signal terminal;
  the third transistor having a gate coupled to the first clock signal terminal, and a first electrode coupled to the first level signal terminal;
  the fourth transistor having a gate coupled to a second electrode of the second transistor and a second electrode of the third transistor, and a first electrode coupled to the second clock signal terminal;
  the fifth transistor having a gate coupled to the second clock signal terminal, and a first electrode coupled to a second electrode of the fourth transistor; and
  the first capacitor being coupled between the gate and the second electrode of the fourth transistor.

In some embodiments, in the above-mentioned shift register provided in the embodiment of the disclosure, the potential maintenance module includes a sixth transistor, a seventh transistor, a second capacitor, and a third capacitor,
  the sixth transistor having a gate coupled to the second electrode of the first transistor, a first electrode coupled to the second level signal terminal, and a second electrode coupled to a second electrode of the fifth transistor;
  the second capacitor being coupled between the second electrode of the sixth transistor and the second level signal terminal;
  the seventh transistor having a gate coupled to the second electrode of the first transistor, and a first electrode coupled to the second clock signal terminal; and
  the third capacitor is coupled between the gate and a second electrode of the seventh transistor.

In some embodiments, in the above-mentioned shift register provided in the embodiment of the disclosure, the output module includes an eighth transistor and a ninth transistor,
  the eighth transistor having a gate coupled to the second electrode of the sixth transistor, a first electrode coupled to the second level signal terminal, and a second electrode coupled to the signal output terminal; and the ninth transistor having a gate coupled to the gate of the seventh transistor, a first electrode coupled to the first level signal terminal, and a second electrode coupled to the signal output terminal.

In some embodiments, in the above-mentioned shift register provided in the embodiment of the disclosure, the pulse width modulation module includes: a first pulse width modulation submodule composed of a tenth transistor and an eleventh transistor, a second pulse width modulation submodule composed of a twelfth transistor and a thirteenth transistor, and a third pulse width modulation submodule composed of a fourteenth transistor and a fifteenth transistor, the tenth transistor having a gate coupled to the second clock signal terminal, and a first electrode coupled to the trigger signal terminal;

the eleventh transistor having a gate coupled to a first enable signal terminal, a first electrode coupled to a second electrode of the tenth transistor, and a second electrode coupled to the gate of the ninth transistor;

the twelfth transistor having a gate coupled to the third clock signal terminal, and a first electrode coupled to the trigger signal terminal;

the thirteenth transistor having a gate coupled to the second enable signal terminal, a first electrode coupled to a second electrode of the twelfth transistor, and a second electrode coupled to the gate of the ninth transistor;

the fourteenth transistor having a gate coupled to a fourth clock signal terminal, and a first electrode coupled to the trigger signal terminal;

the fifteenth transistor having a gate coupled to a third enable signal terminal, a first electrode coupled to a second electrode of the fourteenth transistor, and a second electrode coupled to the gate of the ninth transistor; and the first clock signal terminal, the second clock signal terminal, the third clock signal terminal, and the fourth clock signal terminal jump successively to the first level.

In some embodiments, in the above-mentioned shift register provided in the embodiment of the disclosure, the first to fifteenth transistors are P-type transistors, the first level is a low level, and the second level is a high level.

In some embodiments, in the above-mentioned shift register provided in the embodiment of the disclosure, the first to fifteenth transistors are N-type transistors, the first level is a high level, and the second level is a low level.

Based on the same disclosed concept, an embodiment of the disclosure further provides a driving method of a shift register, the method including:

in a preparation phase, applying a second level to a trigger signal terminal, and a first level to a first clock signal terminal, such that an input module writes the second level of the trigger signal terminal to a second control terminal of an output module;

in a pull-up phase, applying the first level to a second clock signal terminal, such that the input module writes the first level of the second clock signal terminal to a first control terminal of the output module, and the output module writes the second level of a second level signal terminal to a signal output terminal;

in a high-potential maintenance phase, applying the first level or the second level to the trigger signal terminal, and applying the first level to the first clock signal terminal, the second clock signal terminal, or one of other clock signal terminals than the first clock signal terminal and the second clock signal terminal, such that the signal output terminal maintains the second level of the second level signal terminal, wherein when the trigger signal terminal jumps from the second level to the first level, the first clock signal terminal is at the second level; and the first clock signal terminal, the second clock signal terminal, and the other clock signal terminals jump successively to the first level;

in a pull-down phase, applying the first level to the trigger signal terminal, and applying the first level to a clock signal terminal and an enable signal terminal, such that a pulse width modulation submodule writes the first level of the trigger signal terminal to the second control terminal of the output module and a control terminal of the potential maintenance module; the output module writes the first level of a first level signal terminal to the signal output terminal; and the potential maintenance module maintains potentials of the first control terminal and the second control terminal of the output module; and in a low-potential maintenance phase, applying the first level to the trigger signal terminal, and applying the first level to the first clock signal terminal, the second clock signal terminal, or one of the other clock signal terminals, such that the signal output terminal maintains the first level of the first level signal terminal.

Based on the same disclosed concept, an embodiment of the disclosure provides a gate drive circuit, which includes a cascaded plurality of shift registers described above, wherein a signal input terminal of a shift register of a first stage is coupled to a trigger signal terminal; and for each shift register of other stages than the first stage, a signal input terminal of the shift register is coupled to a signal output terminal of shift register of a previous stage.

Based on the same disclosed concept, an embodiment of the disclosure provides a display device, which includes the above-mentioned gate drive circuit.

The disclosure has the following beneficial effects.

According to the shift register, driving method thereof, gate drive circuit and display device provided in embodiments of the disclosure, the shift register includes an input module, an output module, a potential maintenance module, and a pulse width modulation module, wherein the input module is coupled to a trigger signal terminal, and the input module is configured to write a second level of the trigger signal terminal to a first control terminal of the output module under the control of a first level of a first clock signal terminal, and write the first level of a second clock signal terminal to a second control terminal of the output module under the control of the first level of the second clock signal terminal; the pulse width modulation module includes a plurality of pulse width modulation submodules, the pulse width modulation submodules being coupled to the trigger signal terminal, and each of the pulse width modulation submodules being configured to write the first level of the trigger signal terminal to a second control terminal of the output module and to a control terminal of the potential maintenance module under the control of the first level of a clock signal terminal and the first level of an enable signal terminal, wherein one of a plurality of clock signal terminals coupled to the pulse width modulation submodules is the second clock signal terminal, and the rest are other clock signal terminals than the first clock signal terminal and the second clock signal terminal; the first clock signal terminal, the second clock signal terminal, and the other clock signal terminals jump successively to the first level; the output module is coupled to a signal output terminal, and the output module is configured to write the second level of a second level signal terminal to the signal output terminal when the trigger signal terminal outputs the second level and the second clock signal terminal outputs a first level, and write the first level of a first level signal terminal to the signal output terminal when the trigger signal terminal and the clock signal terminal simultaneously output the first level; and the potential maintenance module is configured to maintain potentials of the first control terminal and the second control terminal of the output module under the control of the first level of the trigger signal terminal. An output pulse width can be reduced by $1/(n+1)$ to $(n-1)/(n+1)$ clock cycle by setting the pulse width modulation module, where n is the number of clock signal terminals in one-to-one correspondence with the enable signal terminals, and the pulse width reduced by $1/(n+1)$ to $(n-1)/(n+1)$ clock cycle needs to be output several times under the condition that the light emitting duration of pixels is unchanged, which is equivalent to increasing the refresh rate and thus making the flicker phenomenon in the process of low gray-scale brightness adjustment less detectable to the human eyes.

DETAILED DESCRIPTION OF THE EMBODIMENTS

To make the objectives, technical solutions and advantages of the embodiments of the disclosure clearer, the technical solutions in the embodiments of the disclosure will be described clearly and completely in conjunction with the accompanying drawings in the embodiments of the disclosure. Obviously, the described embodiments are only a part of the embodiments of the disclosure, and not all the embodiments. Based on the described embodiments of the disclosure, all other embodiments obtained by those of ordinary skill in the art without creative work shall fall into the protection scope of the disclosure.

Unless otherwise defined, technical or scientific terms used herein shall have ordinary meanings as understood by those of ordinary skill in the art to which the disclosure pertains. The words "first", "second" and the like used in the description and the claims of disclosure do not indicate any order, quantity or importance, but are only used to distinguish different components. The word "comprise" or "include" or the like means that an element or item appearing before such a word covers listed elements or items appearing after the word and equivalents thereof, and does not exclude other elements or items. The words "inner", "outer", "up", "down", and the like are only used to indicate a relative positional relationship. When the absolute position of a described object changes, the relative positional relationship may also change accordingly.

Figure 1:
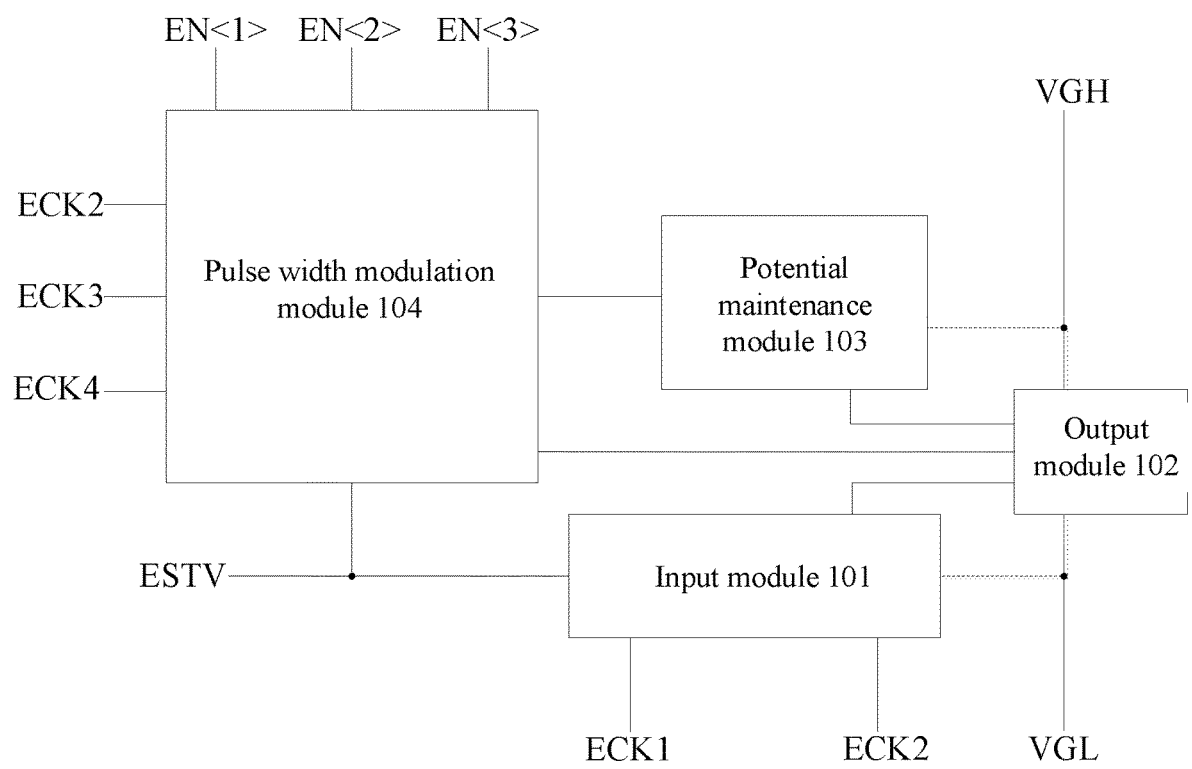
FIG. 1 shows a structure diagram of a shift register provided in an embodiment of the disclosure.

A shift register provided in an embodiment of the disclosure, as shown in FIG. 1, includes an input module 101, an output module 102, a potential maintenance module 103 and a pulse width modulation module 104.

The input module 101 is coupled to a trigger signal terminal ESTV, and the input module 101 is configured to write a second level of the trigger signal terminal ESTV to a first control terminal of the output module 102 under the control of a first level of a first clock signal terminal ECK1, and write the first level of a second clock signal terminal ECK2 to a second control terminal of the output module 102 under the control of the first level of the second clock signal terminal ECK2.

The pulse width modulation module 104 includes a plurality of pulse width modulation submodules, the pulse width modulation submodules being coupled to the trigger signal terminal ESTV, and each of the pulse width modulation submodules being configured to write the first level of the trigger signal terminal ESTV to a second control terminal of the output module 102 and to a control terminal of the potential maintenance module 103 under the control of the first level of a clock signal terminal and the first level of an enable signal terminal.

One of a plurality of clock signal terminals coupled to the pulse width modulation submodules is the second clock signal terminal ECK2, and the rest are other clock signal terminals than the first clock signal terminal ECK1 and the second clock signal terminal ECK2; the first clock signal terminal ECK1, the second clock signal terminal ECK2, and the other clock signal terminals jump successively to the first level.

The output module 102 is coupled to a signal output terminal EOUT, and the output module 102 is configured to write the second level of a second level signal terminal VGH to the signal output terminal EOUT when the trigger signal terminal ESTV outputs the second level and the second clock signal terminal ECK2 outputs a first level, and write the first level of a first level signal terminal VGL to the signal output terminal EOUT when the trigger signal terminal ESTV and the clock signal terminal simultaneously output the first level.

The potential maintenance module 103 is configured to maintain potentials of the first control terminal and the second control terminal of the output module 102 under the control of the first level of the trigger signal terminal ESTV.

In the above-mentioned shift register provided in the embodiment of the disclosure, an output pulse width can be reduced by $1/(n+1)$ to $(n-1)/(n+1)$ clock cycle by setting the pulse width modulation module 104, where n is the number of clock signal terminals in one-to-one correspondence with the enable signal terminals, and the pulse width reduced by $1/(n+1)$ to $(n-1)/(n+1)$ clock cycle needs to be output several times under the condition that the light emitting duration of pixels is unchanged, which is equivalent to increasing the refresh rate and thus making the flicker phenomenon in the process of low gray-scale brightness adjustment less detectable to the human eyes.

In some embodiments, the clock signal terminals in one-to-one correspondence with the enable signal terminals jump successively to the first level, such that during actual operation, the plurality of pulse width modulation submodules included in the pulse width modulation module 104 operate according to the time when the clock signal terminals jump to the first level, to reduce the output pulse width by $1/(n+1)$ to $(n-1)/(n+1)$ clock cycle. In other words, during a pulse width modulation process, one of the plurality of pulse width modulation submodules included in the pulse width modulation module 104 is in an operating state and the rest are in an idle state, and the pulse width modulation submodule in the operating state decreases the output pulse width of the shift register by a corresponding clock cycle through a combination of a clock signal terminal and an enable signal terminal coupled thereto. For example, in the case where the pulse width modulation submodule in the operating state is coupled to the second clock signal terminal ECK2 and a first enable signal terminal EN<1>, the pulse width modulation submodule reduces the output pulse width of the shift register by (n−1)/(n+1) clock cycle.

Figure 2:
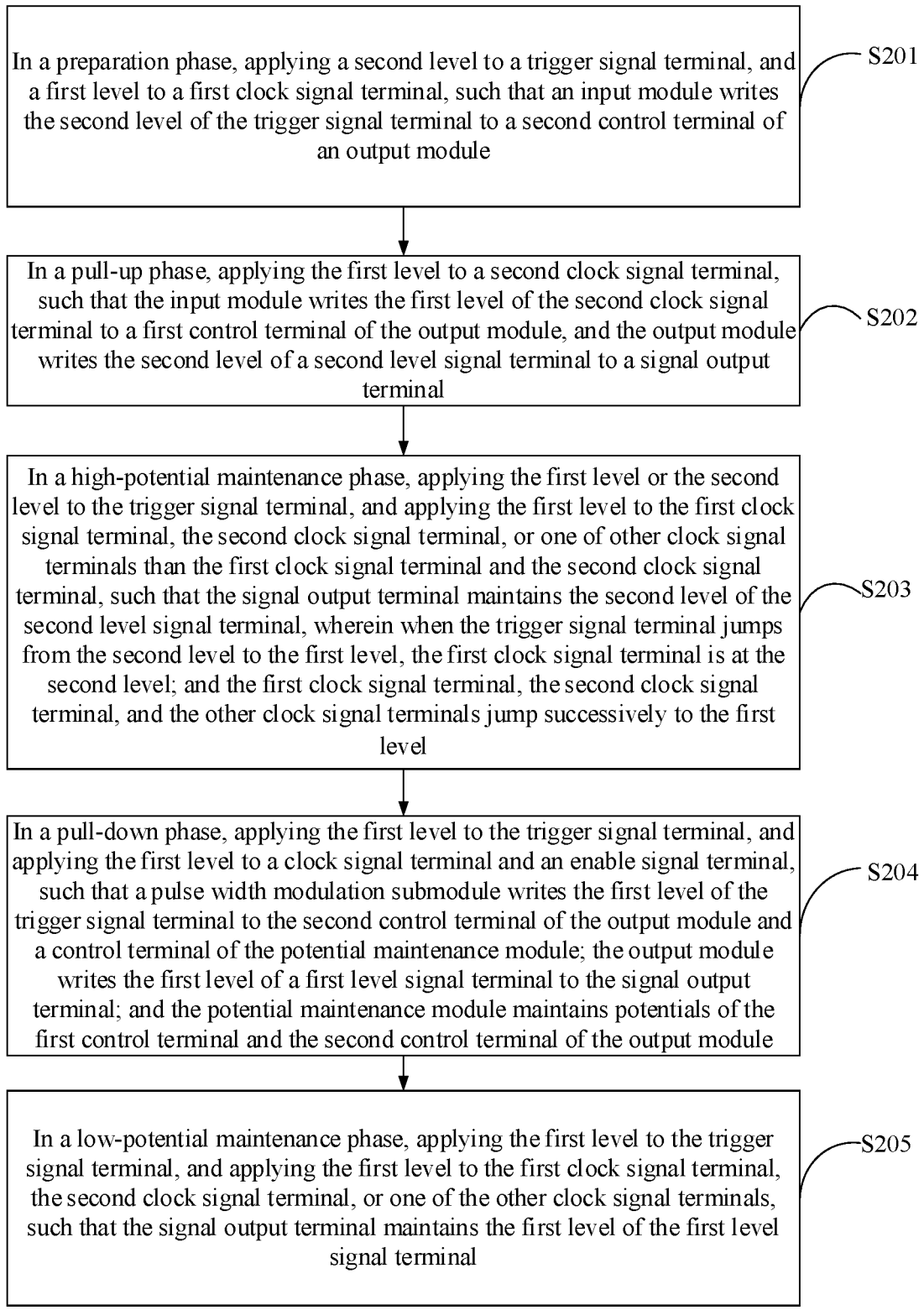
FIG. 2 shows a flow diagram of a method of driving the shift register provided in an embodiment of the disclosure.

Correspondingly, an embodiment of the disclosure further provides a driving method of a shift register, as shown in FIG. 2, which includes the following steps.

S201, in a preparation phase, applying a second level to a trigger signal terminal, and a first level to a first clock signal terminal, such that an input module writes the second level of the trigger signal terminal to a second control terminal of an output module.

S202, in a pull-up phase, applying the first level to a second clock signal terminal, such that the input module writes the first level of the second clock signal terminal to a first control terminal of the output module, and the output module writes the second level of a second level signal terminal to a signal output terminal.

S203, in a high-potential maintenance phase, applying the first level or the second level to the trigger signal terminal, and applying the first level to the first clock signal terminal, the second clock signal terminal, or one of other clock signal terminals than the first clock signal terminal and the second clock signal terminal, such that the signal output terminal maintains at the second level of the second level signal terminal.

When the trigger signal terminal jumps from the second level to the first level, the first clock signal terminal is at the second level; and the first clock signal terminal, the second clock signal terminal, and the other clock signal terminals jump successively to the first level.

S204, in a pull-down phase, applying the first level to the trigger signal terminal, and applying the first level to a clock signal terminal and an enable signal terminal, such that a pulse width modulation submodule writes the first level of the trigger signal terminal to the second control terminal of the output module and a control terminal of the potential maintenance module; the output module writes the first level of a first level signal terminal to the signal output terminal; and the potential maintenance module maintains potentials of the first control terminal and the second control terminal of the output module.

S205, in a low-potential maintenance phase, applying the first level to the trigger signal terminal, and applying the first level to the first clock signal terminal, the second clock signal terminal, or one of the other clock signal terminals, such that the signal output terminal maintains at the first level of the first level signal terminal.

To better understand the structure and working principle of the above-mentioned shift register provided in the embodiment of the disclosure, detailed description is given below with a specific embodiment.

Figure 3:
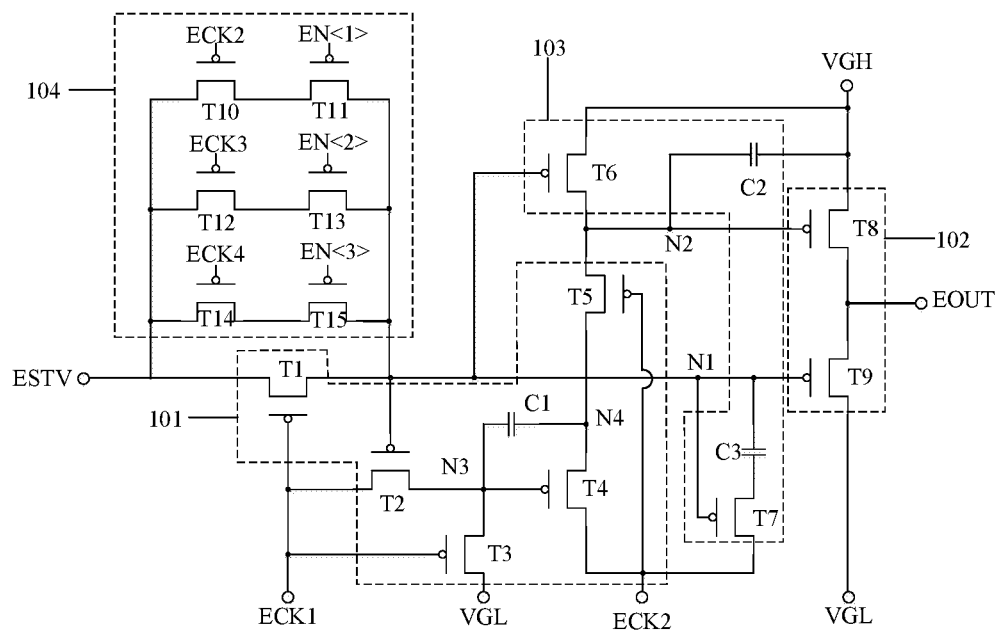
FIG. 3 shows a schematic diagram of one of detailed structures of the shift register shown in FIG. 1.

In some embodiments, the structure shown in FIG. 3 is a possible implementation of a shift register provided in an embodiment of the disclosure.

As shown in FIG. 3, the input module 101 includes a first transistor T1, a second transistor T2, a third transistor T3, a fourth transistor T4, a fifth transistor T5, and a first capacitor C1.

A gate of the first transistor T1 is coupled to the first clock signal terminal ECK1, and a first electrode of the first transistor T1 is coupled to the trigger signal terminal ESTV.

The second transistor T2 has a gate coupled to a second electrode of the first transistor T1, and a first electrode coupled to the first clock signal terminal ECK1.

The third transistor T3 has a gate coupled to the first clock signal terminal ECK1, and a first electrode coupled to the first level signal terminal VGL.

The fourth transistor T4 has a gate coupled to a second electrode of the second transistor T2 and a second electrode of the third transistor T3, and a first electrode coupled to the second clock signal terminal ECK2.

The fifth transistor T5 has a gate coupled to the second clock signal terminal ECK2, and a first electrode coupled to a second electrode of the fourth transistor T4.

The first capacitor C1 is coupled between the gate and the second electrode of the fourth transistor T4.

The potential maintenance module 103 includes a sixth transistor T6, a seventh transistor T7, a second capacitor C2, and a third capacitor C3.

The sixth transistor T6 has a gate coupled to the second electrode of the first transistor T1, a first electrode coupled to the second level signal terminal VGH, and a second electrode coupled to a second electrode of the fifth transistor T5.

The second capacitor C2 is coupled between the second electrode of the sixth transistor T6 and the second level signal terminal VGH.

The seventh transistor T7 having a gate coupled to the second electrode of the first transistor T1, and a first electrode coupled to the second clock signal terminal ECK2.

The third capacitor C3 is coupled between the gate and a second electrode of the seventh transistor T7.

The output module 102 includes: an eighth transistor T8 and a ninth transistor T9.

The eighth transistor T8 has a gate coupled to the second electrode of the sixth transistor T6, a first electrode coupled to the second level signal terminal VGH, and a second electrode coupled to the signal output terminal EOUT.

The ninth transistor T9 has a gate coupled to the gate of the seventh transistor T7, a first electrode coupled to the first level signal terminal VGL, and a second electrode coupled to the signal output terminal EOUT.

The pulse width modulation module 104 includes: a first pulse width modulation submodule composed of a tenth transistor T10 and an eleventh transistor T11, a second pulse width modulation submodule composed of a twelfth transistor T12 and a thirteenth transistor T13, and a third pulse width modulation submodule composed of a fourteenth transistor T14 and a fifteenth transistor T15.

The tenth transistor T10 has a gate coupled to the second clock signal terminal ECK2, and a first electrode coupled to the trigger signal terminal ESTV.

The eleventh transistor T11 has a gate coupled to a first enable signal terminal EN<1>, a first electrode coupled to a second electrode of the tenth transistor T10, and a second electrode coupled to the gate of the ninth transistor T9.

The twelfth transistor T12 has a gate coupled to the third clock signal terminal ECK3, and a first electrode coupled to the trigger signal terminal ESTV.

The thirteenth transistor T13 has a gate coupled to the second enable signal terminal EN<2>, a first electrode coupled to a second electrode of the twelfth transistor T12, and a second electrode coupled to the gate of the ninth transistor T9.

The fourteenth transistor T14 has a gate coupled to a fourth clock signal terminal ECK4, and a first electrode coupled to the trigger signal terminal ESTV.

The fifteenth transistor T15 has a gate coupled to a third enable signal terminal EN<3>, a first electrode coupled to a second electrode of the fourteenth transistor T14, and a second electrode coupled to the gate of the ninth transistor T9.

The first clock signal terminal ECK1, the second clock signal terminal ECK2, the third clock signal terminal ECK3, and the fourth clock signal terminal ECK4 jump successively to the first level.

It is to be noted that described above is only an example of the specific structures of the modules in the above-mentioned shift register provided in the embodiment of the disclosure. In specific implementation, the specific structures of the modules are not limited to the above-mentioned structures provided in the embodiment of the disclosure, but may also be other structures known to those skilled in the art, which are not limited here.

In addition, the first to fifteenth switching transistors T1 to T15 mentioned in the disclosure may be thin film transistors (TFTs), and may also be metal oxide semiconductor (MOS) field effect transistors, and are not limited here. In specific implementation, the first and second electrodes of these transistors are drains and sources, respectively, and their functions are interchangeable depending on the types of transistors and different input signals, which are not differentiated specifically here. Generally, in the case where the transistors are P-type transistors, the first electrodes are sources and the second electrodes are drains; and in the case where the transistors are N-type transistors, the first electrodes are drains and the second electrodes are sources. Furthermore, in the case where the first to fifteenth transistors T1 to T15 are P-type transistors, the first level is a low level, and the second level is a high level. In the case where the first to fifteenth transistors T1 to T15 are N-type transistors, the first level is a high level, and the second level is a low level.

A working process of the shift register shown in FIG. 3 is described below. In the shift register shown in FIG. 3, the transistors are P-type transistors, and are turned on at the low level and cut off at the high level; corresponding simulation timing diagrams of the shift register are shown in FIGS. 4 to 7; specifically, the preparation phase t1, the pull-up phase t2, the high-potential maintenance phase t3, the pull-down phase t4 and the low-potential maintenance phase t5 of the simulation timing diagrams shown in FIGS. 4 to 7 are used as an example for detailed introduction.

It is to be noted that when the output pulse width of the shift register is adjusted by using only the trigger signal terminal ESTV, the first enable signal terminal EN<1>, the second enable signal terminal EN<2> and the third enable signal terminal EN<3> are set to a high potential; and when the output pulse width needs to be fine-tuned, a corresponding enable signal terminal is set to a low potential.

Figure 4:
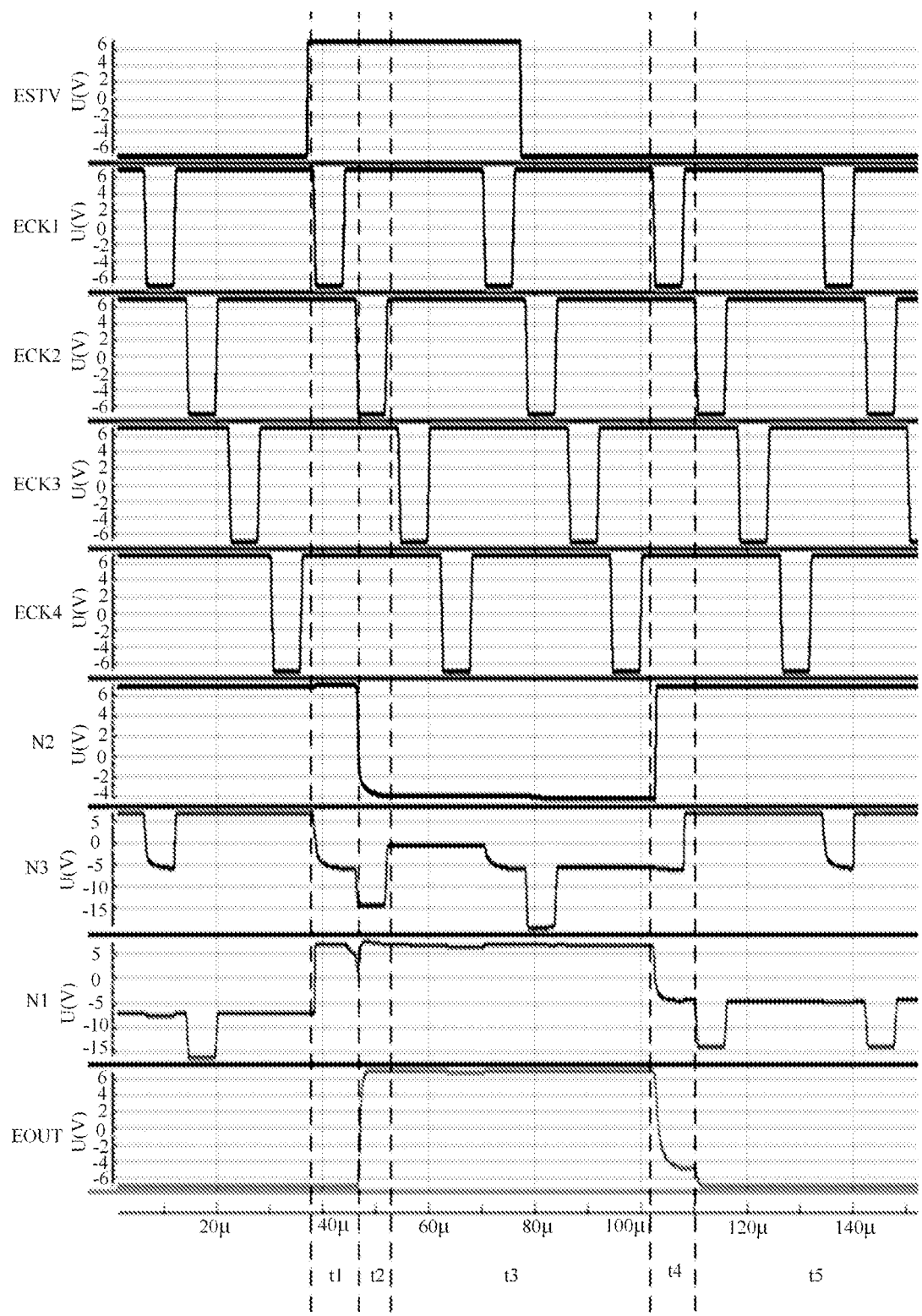
FIGS. 4 to 7 each illustrates simulation timing chart of the shift register shown in FIG. 2.

In some embodiments, when the output pulse width is adjusted by using only the trigger signal terminal ESTV, a working process of the shift register works, as shown in FIG. 4, is specifically as follows.

Preparation phase t1: the trigger signal terminal ESTV jumps to the high potential, the first clock signal terminal ECK1 jumps to the low potential, the first transistor T1 is turned on and transmits the high potential of the trigger signal terminal ESTV to a node N1, and the second transistor T2, the sixth transistor T6 and the ninth transistor T9 are turned off. The low potential of the first clock signal terminal ECK1 turns on the third transistor T3, a node N3 is pulled down to VGL+|Vthp|, and the fourth transistor T4 is turned on and transmits the high potential of the second clock signal terminal ECK2 (specifically same as the second level of the second level signal terminal VGH) to a node N4, such that the potential difference between two electrodes of the first capacitor C1 is VGH−VGL−|Vthp|. Vthp is a threshold voltage of the third transistor T3.

Pull-up phase t2: the trigger signal terminal ESTV is still at the high potential, the second clock signal terminal ECK2 jumps to the low potential, and the first clock signal terminal ECK1 jumps to the high potential. Since the first capacitor C1 stores a potential during the preparation phase t1, when the second clock signal terminal ECK2 jumps to the low potential, the stored potential of the first capacitor C1 cannot change abruptly, the potential of the N3 node is lifted to a lower potential 2VGL−VGH+|Vthp| by the first capacitor C1, the fourth transistor T4 may be turned on well, and the low potential of the first level signal terminal VGL is transmitted to the node N4 node without threshold loss. The low level of the second clock signal terminal ECK2 turns on the fifth transistor T5, the potential of a node N2 is pulled low, and the eighth transistor T8 is turned on, and pulls up the potential of the signal output EOUT to the high potential of the second level signal terminal VGH.

High-potential maintenance phase t3: in this phase, the trigger signal terminal ESTV is still at the high level, and in high-to-low jump processes of the clock signal terminals ECK1-4, a circuit working process is a repetition of the phases t1 and t2 as long as the time when the trigger signal terminal ESTV jumps to low is not the time when the first clock signal terminal ECK1 jumps to low, i.e., it ensure that when the trigger signal terminal ESTV jumps from the high potential to the low potential, the first clock signal terminal ECK1 is at the high potential.

Pull-down phase t4: The trigger signal terminal ESTV is at the low potential, and the first clock signal terminal ECK1 jumps to the low potential. At that time, the first transistor T1 is turned on, the low potential of the trigger signal terminal ESTV is written to the node N1, the ninth transistor T9 is turned on, and the potential of the signal output terminal EOUT is pulled down. After the low potential of the trigger signal terminal ESTV is written to the node N1, the seventh transistor T7 is turned on, and the third capacitor C3 has a negative potential. When the second clock signal terminal ECK2 jumps to low, the potential of the node N1 is pulled lower, which increases the drive pull-down capability of the ninth transistor T9. The signal output EOUT outputs the low potential of the first level signal terminal VGL without threshold loss. In addition, after the low potential of the trigger signal terminal ESTV is written to the node N1, the sixth transistor T6 is turned on, the potential of the node N1 is pulled high, and the eighth transistor T8 is turned off, and does not influence outputting, by the signal output terminal EOUT, the low level of the first level signal terminal VGL.

Low-potential maintenance phase t5: the trigger signal terminal ESTV is always at the low potential, and the clock signal terminals ECK1-4 periodically repeat the working process of t4 to stabilize the node N1 at the low potential and stabilize the node N2 at the high potential, such that the signal output terminal EOUT is well maintained at the low potential.

In the subsequent time, the shift register repeats the process of t1-t5 described above.

The only difference between a process of fine-tuning the output pulse width by using a combination of an enable signal terminal and a clock signal terminal differs from the process of adjusting the output pulse width by using only the trigger signal terminal ESTV lies in the phase t4, which may be divided into three situations depending on the fine-tuned width.

Figure 5:
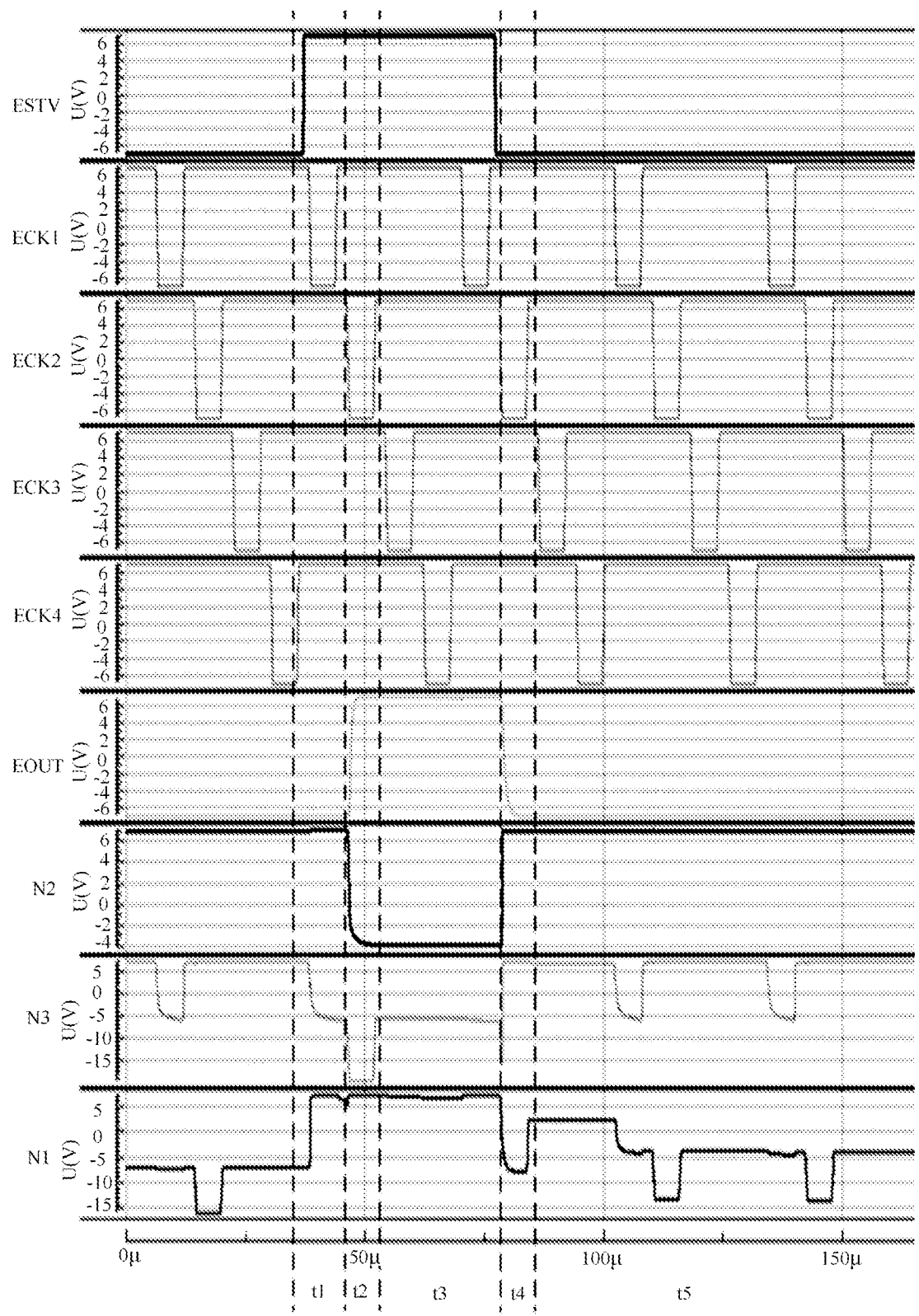

As shown in FIG. 5, when the first enable signal terminal EN<1> is at the low level, the output pulse width may be reduced by ¾ clock cycle. The principle is that in the pull-down phase t4, when the first enable signal terminal EN<1>, the second clock signal terminal ECK2, and the trigger signal terminal ESTV are at the low potential at the same time, the tenth transistor T10 and the eleventh transistor T11 are turned on, the potential of the node N1 is pulled low, the ninth transistor T9 is turned on, and the potential of the signal output terminal EOUT is pulled low.

Figure 6:
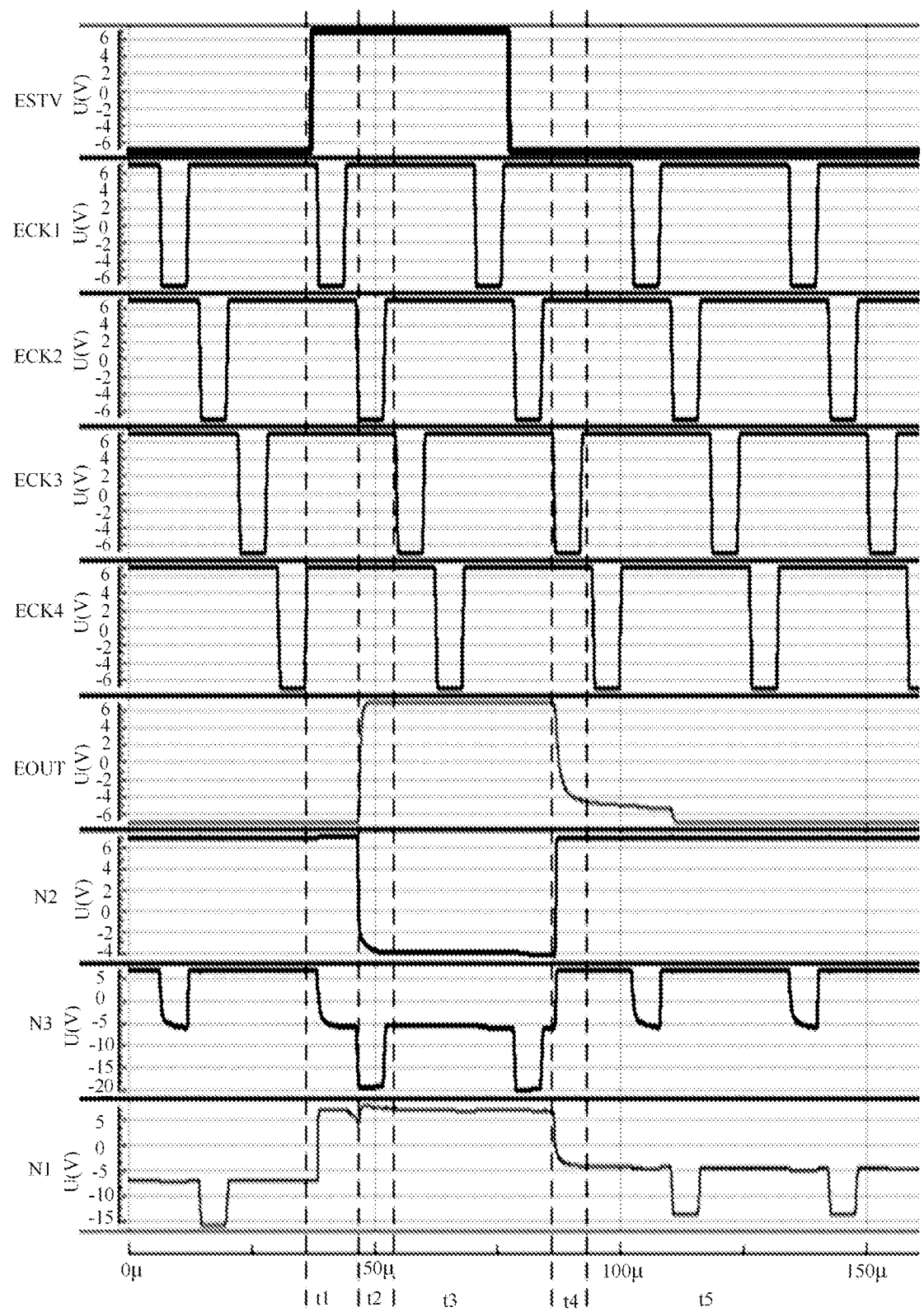

As shown in FIG. 6, when the second enable signal terminal EN<2> is at the low level, the output pulse width may be reduced by ½ clock cycle. The principle is that in the pull-down phase t4, when the second enable signal terminal EN<2>, the third clock signal terminal ECK3, and the trigger signal terminal ESTV are at the low potential at the same time, the twelfth transistor T12 and the thirteenth transistor T13 are turned on, the potential of the node N1 is pulled low, and the ninth transistor T9 is turned on, and the potential of the signal output terminal EOUT is pulled low.

Figure 7:
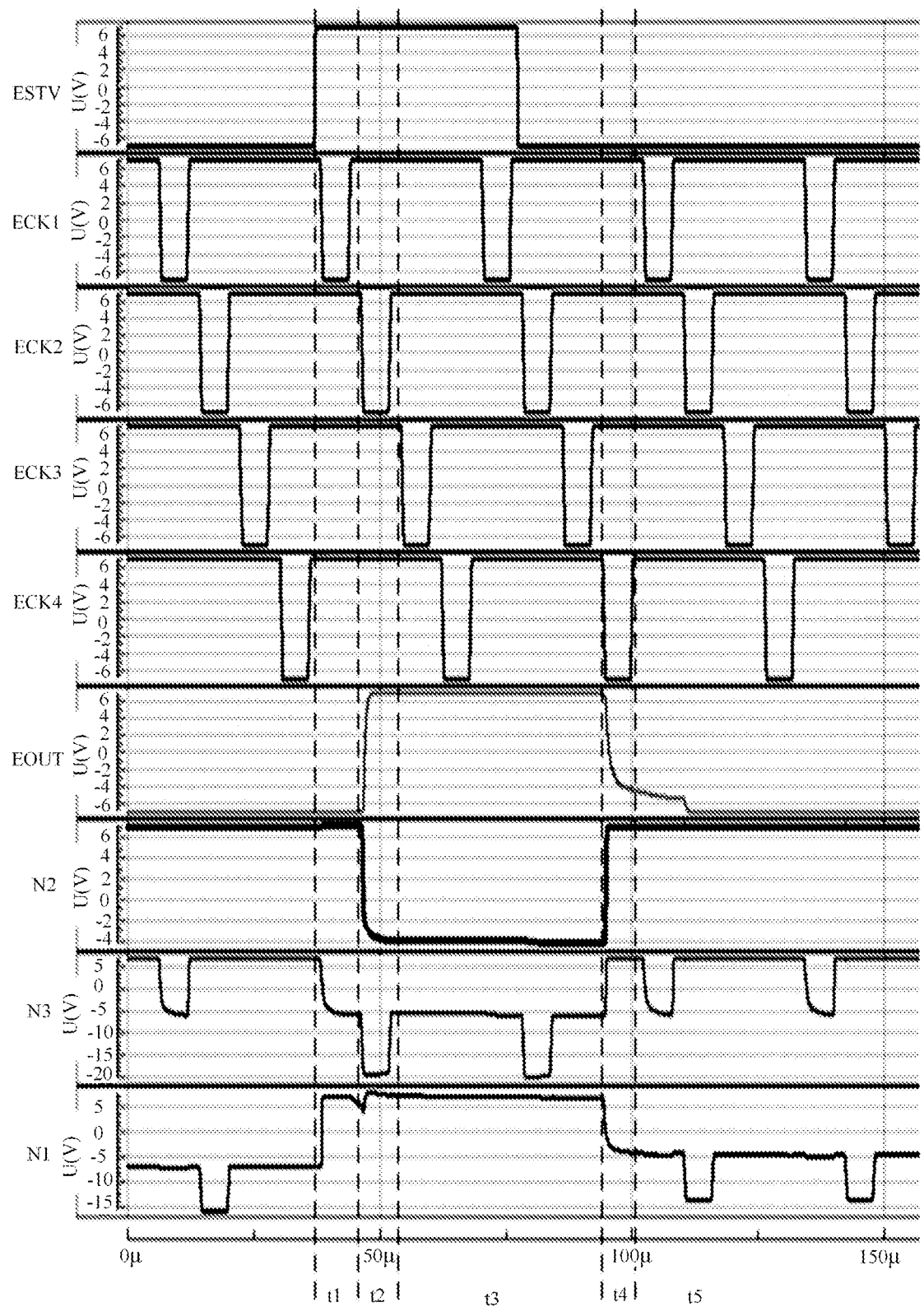

As shown in FIG. 7, when the third enable signal terminal EN<3> is at the low level, the output pulse width may be reduced by ¼ clock cycle. The principle is that in the pull-down phase t4, when the third enable signal terminal EN<3>, the fourth clock signal terminal ECK4, and the trigger signal terminal ESTV are at the low potential at the same time, the fourteenth transistor T14 and the fifteenth transistor T15 are turned on, the potential of the node N1 is pulled low, the ninth transistor T9 is turned on, and the potential of the signal output terminal EOUT is pulled low.

It is to be noted that, comparing FIGS. 5 to 7, it can be seen that the combination of the first enable signal terminal EN<1> and the second clock signal terminal ECK2 can quickly pull down the potential of the signal output terminal EOUT while reducing the output pulse width; in some embodiments, as shown in FIG. 5, in the phase t4, the low potential of the signal output terminal EOUT reaches a minimum value. The combination of the second enable signal terminal EN<2> and the third clock signal terminal ECK3 (a corresponding simulation diagram is FIG. 6) or the combination of the third enable signal terminal EN<3> and the fourth clock signal terminal ECK4 (a corresponding simulation diagram is FIG. 7) pulls down the potential of the signal output EOUT by an amplitude not greater than the pull-down amplitude achieved by the combination of the first enable signal terminal EN<1> and the second clock signal terminal ECK2, while reducing the output pulse width.

In addition, the number of the enable signal terminals of the disclosure is not limited to 3, but may also be n, and the number of the clock signal terminals corresponding to the enable signal terminals may also be n, so the fine-tuning amplitude may be increased to $1/(n+1)$ to $(n-1)/(n+1)$ clock cycle. Optionally, to avoid a very large change, the value of n is greater than or equal to 4 and smaller than or equal to 8.

In summary, in the above-mentioned shift register provided in the embodiment of the disclosure, based on different pulse width outputs achieved by adjusting the pulse width of the trigger signal terminal ESTV, an output pulse width may also be further fine-tuned by using a combination of an enable signal terminal and a clock signal terminal, such that the output pulse width can be reduced by $1/(n+1)$ to $(n-1)/(n+1)$ clock cycle, and the pulse width reduced by $1/(n+1)$ to $(n-1)/(n+1)$ clock cycle needs to be output several times under the condition that the light emitting duration of pixels is unchanged, which is equivalent to increasing the refresh rate and thus well improving the flicker problem in low gray-scale brightness adjustment.

Figure 8:
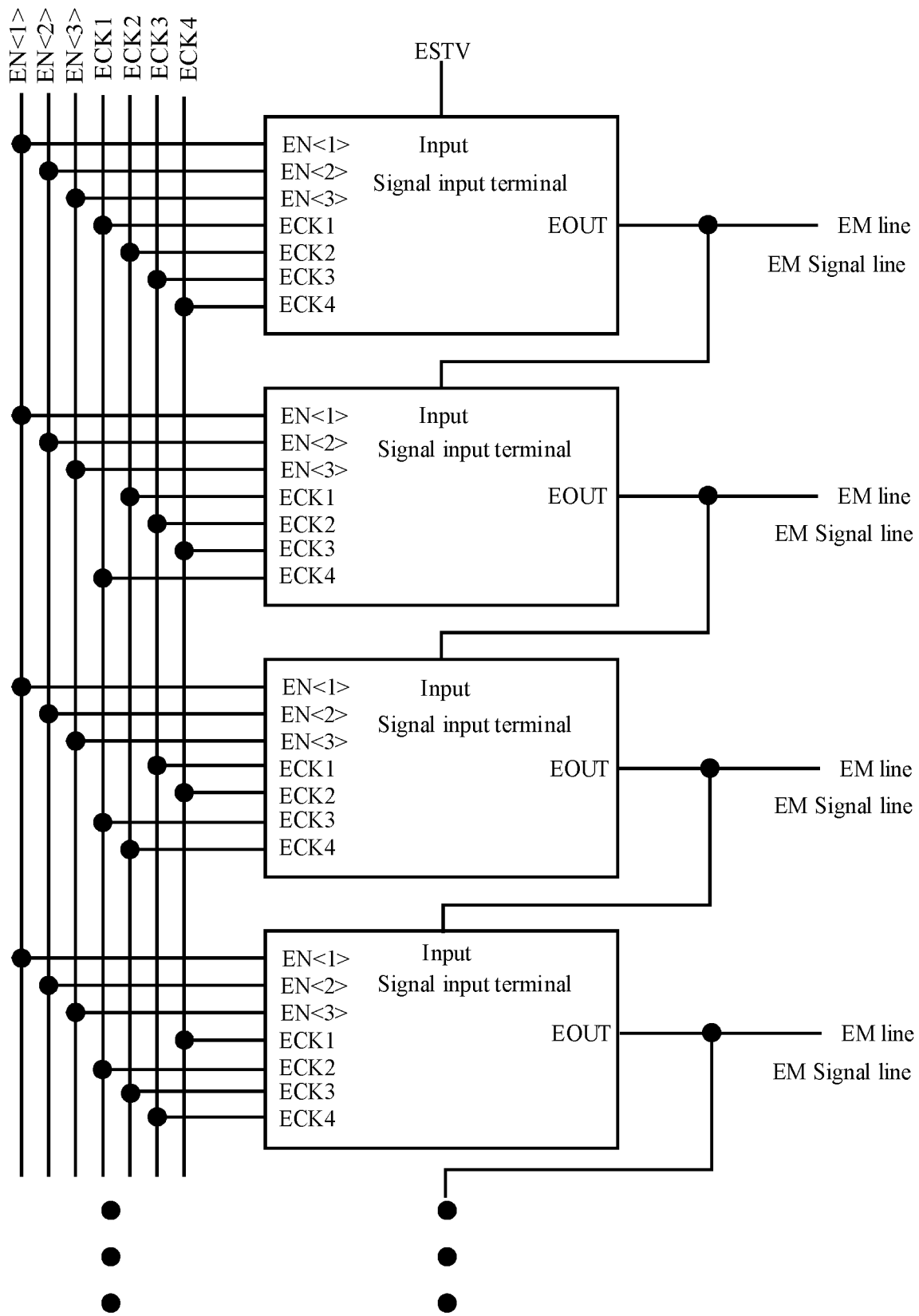
FIG. 8 is a structural diagram of a gate drive circuit provided in an embodiment of the disclosure.

Based on the same inventive concept, an embodiment of the disclosure provides a gate drive circuit, as shown in FIG. 8, which includes a cascaded plurality of shift registers described above, wherein
 a signal input terminal Input of a shift register of a first stage is coupled to a trigger signal terminal ESTV; and
 for each shift register of other stages than the first stage, signal input terminal Input of the shift register is coupled to signal output terminal EOUT of shift register of the previous stage.

Furthermore, in general, in the above-mentioned gate drive circuit provided in an embodiment of the disclosure, as shown in FIG. 8, the work timing of ECK1 to ECK4 is generally based on four adjacent shift registers in one cycle. For example, in one cycle shown in FIG. 8, for a first shift register, the work order of ECK1 to ECK4 is ECK1→ECK2→ECK3→ECK4; for a second shift register, the work order of ECK1 to ECK4 is ECK4→ECK1→ECK2→ECK3; for a third shift register, the work order of ECK1 to ECK4 is ECK3→ECK4→ECK1→ECK2; and for a fourth shift register, the work order of ECK1 to ECK4 is ECK2→ECK3→ECK4→ECK1.

Based on the same inventive concept, an embodiment of the disclosure further provides a display device including the above-mentioned gate drive circuit provided in an embodiment of the disclosure. The display device may be a mobile phone, a tablet computer, a television, a display, a notebook computer, a digital photo frame, a navigator, or any other product or component with a display function. Other indispensable components of the display device are present as understandable by those skilled in the art, and are not described herein, nor should they be construed as limiting the disclosure. In addition, the problem-solving principle of the display device is similar to that of the above-mentioned gate drive circuit, and thus for the implementation of the display device, reference may be made to the embodiment of the above-mentioned gate drive circuit, and repeated description is omitted.

According to the above-mentioned shift register, driving method thereof, gate drive circuit and display device provided in embodiments of the disclosure, the shift register includes an input module, an output module, a potential maintenance module, and a pulse width modulation module, wherein the input module is coupled to a trigger signal terminal, and the input module is configured to write a second level of the trigger signal terminal to a first control terminal of the output module under the control of a first level of a first clock signal terminal, and write the first level of a second clock signal terminal to a second control terminal of the output module under the control of the first level of the second clock signal terminal; the pulse width modulation module includes a plurality of pulse width modulation submodules, the pulse width modulation submodules being coupled to the trigger signal terminal, and each of the pulse width modulation submodules being configured to write the first level of the trigger signal terminal to a second control terminal of the output module and to a control terminal of the potential maintenance module under the control of the first level of a clock signal terminal and the first level of an enable signal terminal, wherein one of a plurality of clock signal terminals coupled to the pulse width modulation submodules is the second clock signal terminal, and the rest are other clock signal terminals than the first clock signal terminal and the second clock signal terminal; the first clock signal terminal, the second clock signal terminal, and the other clock signal terminals jump successively to the first level; the output module is coupled to a signal output terminal, and the output module is configured to write the second level of a second level signal terminal to the signal output terminal when the trigger signal terminal outputs the second level and the second clock signal terminal outputs a first level, and write the first level of a first level signal terminal to the signal output terminal when the trigger signal terminal and the clock signal terminal simultaneously output the first level; and the potential maintenance module is configured to maintain potentials of the first control terminal and the second control terminal of the output module under the control of the first level of the trigger signal terminal. An output pulse width can be reduced by $1/(n+1)$ to $(n-1)/(n+1)$ clock cycle by setting the pulse width modulation module, where n is the number of clock signal terminals in one-to-one correspondence with the enable signal terminals, and the pulse width reduced by $1/(n+1)$ to $(n-1)/(n+1)$ clock cycle needs to be output several times under the condition that the light emitting duration of pixels is unchanged, which is equivalent to increasing the refresh rate and thus making the flicker phenomenon in the process of low gray-scale brightness adjustment less detectable to the human eyes.

Obviously, those skilled in the art can make various modifications and variations to the disclosure without departing from the spirit and scope of the disclosure. Thus, the disclosure is also intended to encompass these modifications and variations thereto so long as the modifications and variations come into the scope of the claims of the disclosure and their equivalents.

What is claimed is:

1. A shift register, comprising: an input circuit, an output circuit, a potential maintenance circuit, and a pulse width modulation circuit,
    wherein the input circuit is coupled to a trigger signal terminal having a first level and a second level, and the input circuit is configured to write the second level of the trigger signal terminal to a first control terminal of the output circuit under control of a first level of a first clock signal terminal, and write a first level of a second clock signal terminal to a second control terminal of the output circuit under control of the first level of the second clock signal terminal;
    the pulse width modulation circuit comprises a plurality of pulse width modulation subcircuits, the plurality of pulse width modulation subcircuits being coupled to the trigger signal terminal, and each of the plurality of pulse width modulation subcircuits being configured to write the first level of the trigger signal terminal to the second control terminal of the output circuit and to a control terminal of the potential maintenance circuit under control of the first level at a clock signal terminal and a first level of an enable signal terminal,
    wherein one of a plurality of clock signal terminals coupled to the plurality of pulse width modulation subcircuits is the second clock signal terminal, and rest of the plurality of clock signal terminals are other clock signal terminals than the first clock signal terminal and the second clock signal terminal; the first clock signal terminal, the second clock signal terminal, and the other clock signal terminals jump successively to the first level of the first clock signal terminal;
    the output circuit is coupled to a signal output terminal, and the output circuit is configured to write a second level of a second level signal terminal to the signal output terminal when the trigger signal terminal outputs the second level and the second clock signal terminal outputs the first level, and write a first level of a first level signal terminal to the signal output terminal when the trigger signal terminal and the clock signal terminal simultaneously output the first level; and
    the potential maintenance circuit is configured to maintain potentials of the first control terminal and the second control terminal of the output circuit under control of the first level of the trigger signal terminal.

2. The shift register of claim 1, wherein the input circuit comprises a first transistor, a second transistor, a third transistor, a fourth transistor, a fifth transistor, and a first capacitor, wherein
    the first transistor has a gate coupled to the first clock signal terminal, and a first electrode coupled to the trigger signal terminal;
    the second transistor has a gate coupled to a second electrode of the first transistor, and a first electrode coupled to the first clock signal terminal;
    the third transistor has a gate coupled to the first clock signal terminal, and a first electrode coupled to the first level signal terminal;
    the fourth transistor has a gate coupled to a second electrode of the second transistor and a second electrode of the third transistor, and a first electrode coupled to the second clock signal terminal;
    the fifth transistor has a gate coupled to the second clock signal terminal, and a first electrode coupled to a second electrode of the fourth transistor; and
    the first capacitor is coupled between the gate and the second electrode of the fourth transistor.

3. The shift register of claim 2, wherein the potential maintenance circuit comprises a sixth transistor, a seventh transistor, a second capacitor, and a third capacitor, wherein
    the sixth transistor has a gate coupled to the second electrode of the first transistor, a first electrode coupled to the second level signal terminal, and a second electrode coupled to a second electrode of the fifth transistor;
    the second capacitor is coupled between the second electrode of the sixth transistor and the second level signal terminal;
    the seventh transistor has a gate coupled to the second electrode of the first transistor, and a first electrode coupled to the second clock signal terminal; and
    the third capacitor is coupled between the gate and a second electrode of the seventh transistor.

4. The shift register of claim 3, wherein the output circuit comprises an eighth transistor and a ninth transistor, wherein
    the eighth transistor has a gate coupled to the second electrode of the sixth transistor, a first electrode coupled to the second level signal terminal, and a second electrode coupled to the signal output terminal; and
    the ninth transistor has a gate coupled to the gate of the seventh transistor, a first electrode coupled to the first level signal terminal, and a second electrode coupled to the signal output terminal.

5. The shift register of claim 4, wherein the pulse width modulation circuit comprises: a first pulse width modulation subcircuit composed of a tenth transistor and an eleventh transistor, a second pulse width modulation subcircuit composed of a twelfth transistor and a thirteenth transistor, and a third pulse width modulation subcircuit composed of a fourteenth transistor and a fifteenth transistor, wherein the tenth transistor has a gate coupled to the second clock signal terminal, and a first electrode coupled to the trigger signal terminal;

the eleventh transistor has a gate coupled to a first enable signal terminal, a first electrode coupled to a second electrode of the tenth transistor, and a second electrode coupled to the gate of the ninth transistor;

the twelfth transistor has a gate coupled to the third clock signal terminal, and a first electrode coupled to the trigger signal terminal;

the thirteenth transistor has a gate coupled to the second enable signal terminal, a first electrode coupled to a second electrode of the twelfth transistor, and a second electrode coupled to the gate of the ninth transistor;

the fourteenth transistor has a gate coupled to a fourth clock signal terminal, and a first electrode coupled to the trigger signal terminal;

the fifteenth transistor has a gate coupled to a third enable signal terminal, a first electrode coupled to a second electrode of the fourteenth transistor, and a second electrode coupled to the gate of the ninth transistor; and the first clock signal terminal, the second clock signal terminal, the third clock signal terminal, and the fourth clock signal terminal jump successively to the first level.

6. The shift register of claim 5, wherein the first to fifteenth transistors are P-type transistors, the first level is lower than the second level.

7. The shift register of claim 5, wherein the first to fifteenth transistors are N-type transistors, the first level is higher than the second level.

8. A method of driving a shift register, comprising:
in a preparation phase, applying a second level to a trigger signal terminal, and a first level to a first clock signal terminal, such that an input circuit writes the second level of the trigger signal terminal to a second control terminal of an output circuit;

in a pull-up phase, applying the first level to a second clock signal terminal, and the second level to the first clock signal terminal, such that the input circuit writes the first level of the second clock signal terminal to a first control terminal of the output circuit, and the output circuit writes a second level of a second level signal terminal to a signal output terminal;

in a high-potential maintenance phase, applying the first level or the second level to the trigger signal terminal, and applying the first level to the first clock signal terminal, the second clock signal terminal, or one of other clock signal terminals than the first clock signal terminal and the second clock signal terminal, such that the signal output terminal maintains the second level of the second level signal terminal,
wherein when the trigger signal terminal jumps from the second level to the first level, the first clock signal terminal is at the second level; and the first clock signal terminal, the second clock signal terminal, and the other clock signal terminals jump successively to the first level;

in a pull-down phase, applying the first level to the trigger signal terminal, and applying the first level to a clock signal terminal and an enable signal terminal, such that a pulse width modulation subcircuit writes the first level of the trigger signal terminal to the second control terminal of the output circuit and a control terminal of the potential maintenance circuit;

the output circuit writes the first level of a first level signal terminal to the signal output terminal; and the potential maintenance circuit maintains potentials of the first control terminal and the second control terminal of the output circuit; and in a low-potential maintenance phase, applying the first level to the trigger signal terminal, and applying the first level to the first clock signal terminal, the second clock signal terminal, or one of the other clock signal terminals, such that the signal output terminal maintains the first level of the first level signal terminal.

9. A gate driving circuit, comprising: a plurality of shift registers by cascading connection, wherein each shift register comprises:

an input circuit, an output circuit, a potential maintenance circuit, and a pulse width modulation circuit, wherein the input circuit is coupled to a trigger signal terminal, and the input circuit is configured to write a second level of the trigger signal terminal to a first control terminal of the output circuit under control of a first level of a first clock signal terminal, and write a first level of a second clock signal terminal to a second control terminal of the output circuit under control of the first level of the second clock signal terminal;

the pulse width modulation circuit comprises a plurality of pulse width modulation subcircuits, the plurality of pulse width modulation subcircuits being coupled to the trigger signal terminal, and each of the plurality of pulse width modulation subcircuits being configured to write the first level of the trigger signal terminal to the second control terminal of the output circuit and to a control terminal of the potential maintenance circuit under control of a first level of a clock signal terminal and a first level of an enable signal terminal, wherein one of a plurality of clock signal terminals coupled to the plurality of pulse width modulation subcircuits is the second clock signal terminal, and rest of the plurality of clock signal terminals are other clock signal terminals than the first clock signal terminal and the second clock signal terminal; the first clock signal terminal, the second clock signal terminal, and the other clock signal terminals jump successively to the first level;

the output circuit is coupled to a signal output terminal, and the output circuit is configured to write a second level of a second level signal terminal to the signal output terminal when the trigger signal terminal outputs the second level and the second clock signal terminal outputs the first level, and write a first level of a first level signal terminal to the signal output terminal when the trigger signal terminal and the clock signal terminal simultaneously output the first level; and the potential maintenance circuit is configured to maintain potentials of the first control terminal and the second control terminal of the output circuit under control of the first level of the trigger signal terminal;

wherein a signal input terminal of a shift register of a first stage is coupled to a trigger signal terminal; and for each shift register of other stages than the first stage, a signal input terminal of the shift register is coupled to a signal output terminal of shift register of a previous stage.

10. A display device, comprising the gate driving circuit of claim 9.

11. The display device of claim 10, wherein the display device comprises an Organic Light Emitting Diode (OLED) display.

12. The gate driving circuit of claim 9, wherein the input circuit comprises a first transistor, a second transistor, a third transistor, a fourth transistor, a fifth transistor, and a first capacitor, wherein the first transistor has a gate coupled to the first clock signal terminal, and a first electrode coupled to the trigger signal terminal;

the second transistor has a gate coupled to a second electrode of the first transistor, and a first electrode coupled to the first clock signal terminal;

the third transistor has a gate coupled to the first clock signal terminal, and a first electrode coupled to the first level signal terminal;

the fourth transistor has a gate coupled to a second electrode of the second transistor and a second electrode of the third transistor, and a first electrode coupled to the second clock signal terminal;

the fifth transistor has a gate coupled to the second clock signal terminal, and a first electrode coupled to a second electrode of the fourth transistor; and the first capacitor is coupled between the gate and the second electrode of the fourth transistor.

13. The gate driving circuit of claim 12, wherein the potential maintenance circuit comprises a sixth transistor, a seventh transistor, a second capacitor, and a third capacitor, wherein the sixth transistor has a gate coupled to the second electrode of the first transistor, a first electrode coupled to the second level signal terminal, and a second electrode coupled to a second electrode of the fifth transistor;

the second capacitor is coupled between the second electrode of the sixth transistor and the second level signal terminal;

the seventh transistor has a gate coupled to the second electrode of the first transistor, and a first electrode coupled to the second clock signal terminal; and the third capacitor is coupled between the gate and a second electrode of the seventh transistor.

14. The gate driving circuit of claim 13, wherein the output circuit comprises an eighth transistor and a ninth transistor, wherein the eighth transistor has a gate coupled to the second electrode of the sixth transistor, a first electrode coupled to the second level signal terminal, and a second electrode coupled to the signal output terminal; and the ninth transistor has a gate coupled to the gate of the seventh transistor, a first electrode coupled to the first level signal terminal, and a second electrode coupled to the signal output terminal.

15. The gate driving circuit of claim 14, wherein the pulse width modulation circuit comprises: a first pulse width modulation subcircuit composed of a tenth transistor and an eleventh transistor, a second pulse width modulation subcircuit composed of a twelfth transistor and a thirteenth transistor, and a third pulse width modulation subcircuit composed of a fourteenth transistor and a fifteenth transistor, wherein the tenth transistor has a gate coupled to the second clock signal terminal, and a first electrode coupled to the trigger signal terminal;

the eleventh transistor has a gate coupled to a first enable signal terminal, a first electrode coupled to a second electrode of the tenth transistor, and a second electrode coupled to the gate of the ninth transistor;

the twelfth transistor has a gate coupled to the third clock signal terminal, and a first electrode coupled to the trigger signal terminal;

the thirteenth transistor has a gate coupled to the second enable signal terminal, a first electrode coupled to a second electrode of the twelfth transistor, and a second electrode coupled to the gate of the ninth transistor;

the fourteenth transistor has a gate coupled to a fourth clock signal terminal, and a first electrode coupled to the trigger signal terminal;

the fifteenth transistor has a gate coupled to a third enable signal terminal, a first electrode coupled to a second electrode of the fourteenth transistor, and a second electrode coupled to the gate of the ninth transistor; and the first clock signal terminal, the second clock signal terminal, the third clock signal terminal, and the fourth clock signal terminal jump successively to the first level.

16. The gate driving circuit of claim 15, wherein the first to fifteenth transistors are P-type transistors, the first level is lower than the second level.

17. The gate driving circuit of claim 15, wherein the first to fifteenth transistors are N-type transistors, the first level is higher than the second level.

* * * * *